United States Patent [19]

Karlmann et al.

[11] Patent Number: 4,736,267

[45] Date of Patent: Apr. 5, 1988

[54] FAULT DETECTION CIRCUIT

[75] Inventors: Thomas F. Karlmann, Hoffman Estates; Adelore F. Petrie, Arlington Heights, both of Ill.; Randall C. Gray, Tempe, Ariz.

[73] Assignee: Motorola, Inc., Schaumburg, Ill.

[21] Appl. No.: 931,535

[22] Filed: Nov. 14, 1986

[51] Int. Cl.[4] .................................... H02H 3/093
[52] U.S. Cl. ............................ 361/101; 361/93; 123/490; 323/285
[58] Field of Search ............... 361/86, 87, 88, 89, 361/93, 94, 100, 101, 154, 187; 123/479, 490; 323/285

[56] References Cited

U.S. PATENT DOCUMENTS

| | | | |
|---|---|---|---|
| 3,491,265 | 1/1970 | Prothero | 317/33 |
| 4,092,690 | 5/1978 | Wilkinson . | |
| 4,293,888 | 10/1981 | McCartz . | |
| 4,338,646 | 7/1982 | Davis et al. . | |
| 4,377,144 | 3/1983 | Takahashi . | |
| 4,379,990 | 4/1983 | Sievers et al. | 322/99 |
| 4,428,020 | 1/1984 | Blanchard, Jr. . | |
| 4,438,473 | 3/1984 | Cawley et al. . | |
| 4,547,715 | 10/1985 | Li | 318/345 B |
| 4,581,551 | 4/1986 | Campbell, Jr. . | |
| 4,589,401 | 5/1986 | Karim et al. | 123/479 |
| 4,618,908 | 10/1986 | Anttila . | |
| 4,628,885 | 12/1986 | Ogburn et al. . | |
| 4,638,396 | 1/1987 | Mukli et al. . | |

OTHER PUBLICATIONS

"Injector Fault Testing Methods" in Motorola Technical Developments, vol. 3, Mar. 1983 by Robert W. Deutsch;

Primary Examiner—A. D. Pellinen
Assistant Examiner—Derek S. Jennings
Attorney, Agent, or Firm—Phillip H. Melamed

[57] ABSTRACT

In a solenoid fuel injection system, an output transistor (16) receives switching signals to control through current therein which is provided to a solenoid fuel injection coil (11) in series with a current sensing resistor (17). A current control circuit (12) provides pulse width modulation control of solenoid current by monitoring the voltage across the sensing resistor. The fault detection circuit provides separate fault signals for short circuits at either the first or second end terminals (E, H) of the solenoid coil. Separate voltage comparators (18, 23) monitor voltages at the first and second end terminals, and separate delay timers (20, 25) effectively gate the comparator outputs to indicate actual detected short circuits. Each of the fault detection signals sets a fault latch (22) which then acts to reduce current through the output transistor and coil. The fault latch is periodically reset. For a fault detection, the output transistor is protected from excessive current resulting from a short circuit at one end terminal (H). The transistor and coil are also protected from a short circuit at the other end terminal (E) which results in the lack of a current sense signal causing the controller (12) to attempt to maintain the output transistor constantly on.

30 Claims, 3 Drawing Sheets

FAULT DETECTION CIRCUIT

CROSS REFERENCE TO RELATED APPLICATIONS

The present invention is related to the invention described in copending U.S. patent application Ser. No. 06/911,946, filed Sept. 26, 1986, entitled "Dual Limit Solenoid Driver Control Circuit", by Adelorie F. Petrie, Thomas Karlmann, Steven Parmelee, and Arthur J. Edwards, and having the same assignee as the present invention.

BACKGROUND OF THE INVENTION

The present invention is related to fault detection circuits for detecting faults in output stages, and protecting components in the output stages in the event of a fault. More specifically, the present invention is related to solenoid driver output stages and fault detection circuits utilized for detecting faults therein.

In known solenoid fuel injector driver output stages, an output power transistor is typically series connected with a solenoid fuel injector coil and a current sensing resistor. The through current of this series connection is sensed by the resistor and utilized by a current limit controller to provide pulse width modulated output signals that are used as a switching excitation signal for the output transistor. In this manner, an effective minimum current for the solenoid coil can be assured during an on-time duration for the fuel injector which corresponds to the existence of a predetermined logic state of a control signal received by the current limit controller.

In such systems, the current limit controller implements current control between predetermined limits for the through current in the solenoid coil and the output transistor. However, short circuits to ground can occur at the end terminals of the solenoid coil, and this can result in having the sensing resistor mistakenly sense that a low or zero current is flowing through the power output device and solenoid coil. This means that the current controller now does not function to limit the current in the coil and output transistor.

Some prior systems have attempted to detect when a short circuit is present at one of the two end terminals of the solenoid coil, and in response to such a fault detection these prior systems have attempted to turn off the power output transistor to protect it and the solenoid coil from excessive current and voltage stress. However, typically the prior systems have been extremely complex, have not been automatically resettable, have not reacted fast enough to the presence of some short circuits to prevent excessive current from flowing through the power transistor for an appreciable time, and/or have not been able to satisfactorily detect the presence of short circuits at either of the two end terminals of the solenoid coil. Because of this, prior fault detection systems have not adequately protected the output stage in the event of a short circuit, and/or have not done so cost effectively. This same sort of fault detection problem exists not only with solenoid driver output stages, but also can exist with voltage regulator output stages which provide field current for the field coil of a vehicle battery charging system. The problem also can exist in switching power supplies.

SUMMARY OF THE INVENTION

An object of the present invention is to provide an improved fault detection circuit for protecting output stage components which overcomes the above-mentioned deficiencies of prior fault detection circuits.

In one embodiment of the present invention, a fault detection circuit is provided comprising: output driver means having a control terminal and at least one output terminal, current through said output driver means determined by signal magnitude at said control terminal; load means having first and second end terminals, said second end terminal coupled to said output terminal such that current through said output driver means determines current through said load means; current sense resistor means connected in series with said load means by being connected to said first end terminal such that current through said resistor means normally corresponds to current through said load means; current control means coupled to said resistor means for, in response to receiving an enable signal having signal transitions to a predetermined logic state, controlling signal magnitude at said control terminal in accordance with current through said resistor means to effectively provide at least a predetermined minimum current level through said load means during said logic state; wherein the improvement comprises, fault detection means coupled to said load means for detecting short circuits present at either of said first and second end terminals and providing separate fault detection signals in response thereto; and fault control means coupled to said fault detection means for altering signal magnitude at said control terminal, in response to said fault detection signals, so as to effectively reduce current through at least one of said output driver means and said load means to prevent damage thereto in the event of a short circuit at any of said end terminals.

Essentially, the above-stated structure of the present invention provides for separate detection of short circuits which may be present at either the first or second end terminals of the load means, which preferably comprises an inductive load corresponding to the solenoid coil of a fuel injector. Preferably, the current control means comprises a dual current limit controller corresponding to the controller described in U.S. patent application Ser. No. 06/911,946 identified above and assigned to the same assignee as the present invention. In such a current controller, in response to an on logic state of an enable signal received by the current controller, the current controller essentially provides pulse width modulated output pulses as an input to an output driver transistor wherein the duration of these pulses is controlled in accordance with the sensed magnitude of current in the load as sensed by the sensing resistor means. This provides control of the effective signal magnitude, via pulse duration control, at the control terminal of the output driver transistor, and this acts to implement control of the load current between predetermined limits. While this type of current controller operation is desirable, particularly in controlling current for a fuel injection solenoid, these systems are subject to error because of short circuits causing the sense resistor to provide a zero current reading when actually substantial current is being drawn through the output transistor and/or the solenoid coil. The present fault detection circuit provides for detecting short circuits present at either of the end terminals of the solenoid coil and accomplishes this by the use of separate voltage comparators monitoring the voltage at each end terminal of the coil. Separate delay timers effectively gate the outputs of these voltage comparators such that fault detections are provided only in response to voltage comparisons which occur during specific time intervals. This is required since prior to enabling the current controller, and at the time of switching on the output stage, typically all currents and voltages in the output stage, which includes the power output transistor, solenoid coil and sensing resistor, are essentially zero.

By the specific circuit configurations utilized in the present invention, rapid detection of short circuits is provided so as to minimize potential damage to the output stage caused by short circuits that would result in extremely high currents being passed through the output transistor and by short circuits which would result in excessive current being provided in the output stage due to the sensing resistor failing to provide an accurate indication of output stage current. This is essentially implemented by separately monitoring each end terminal of the inductive load for short circuits.

The present invention can also be analyzed as providing separate first and second fault detection signals in response to either the effective voltage across the load or the current through the load failing to meet specified criteria when the output driver means is switched to provide current through the load. This is equivalent to the monitoring of the voltages at the first and second end terminals in the presently described circuit configuration.

The above-noted features of the present invention, as well as the operation and additional aspects of the present invention, will now be discussed in detail.

BRIEF DESCRIPTION OF THE DRAWINGS

For a more complete understanding of the present invention, reference should be made to the drawings in which.

DESCRIPTION OF THE PREFERRED EMBODIMENTS OF THE INVENTION

Figure 1:
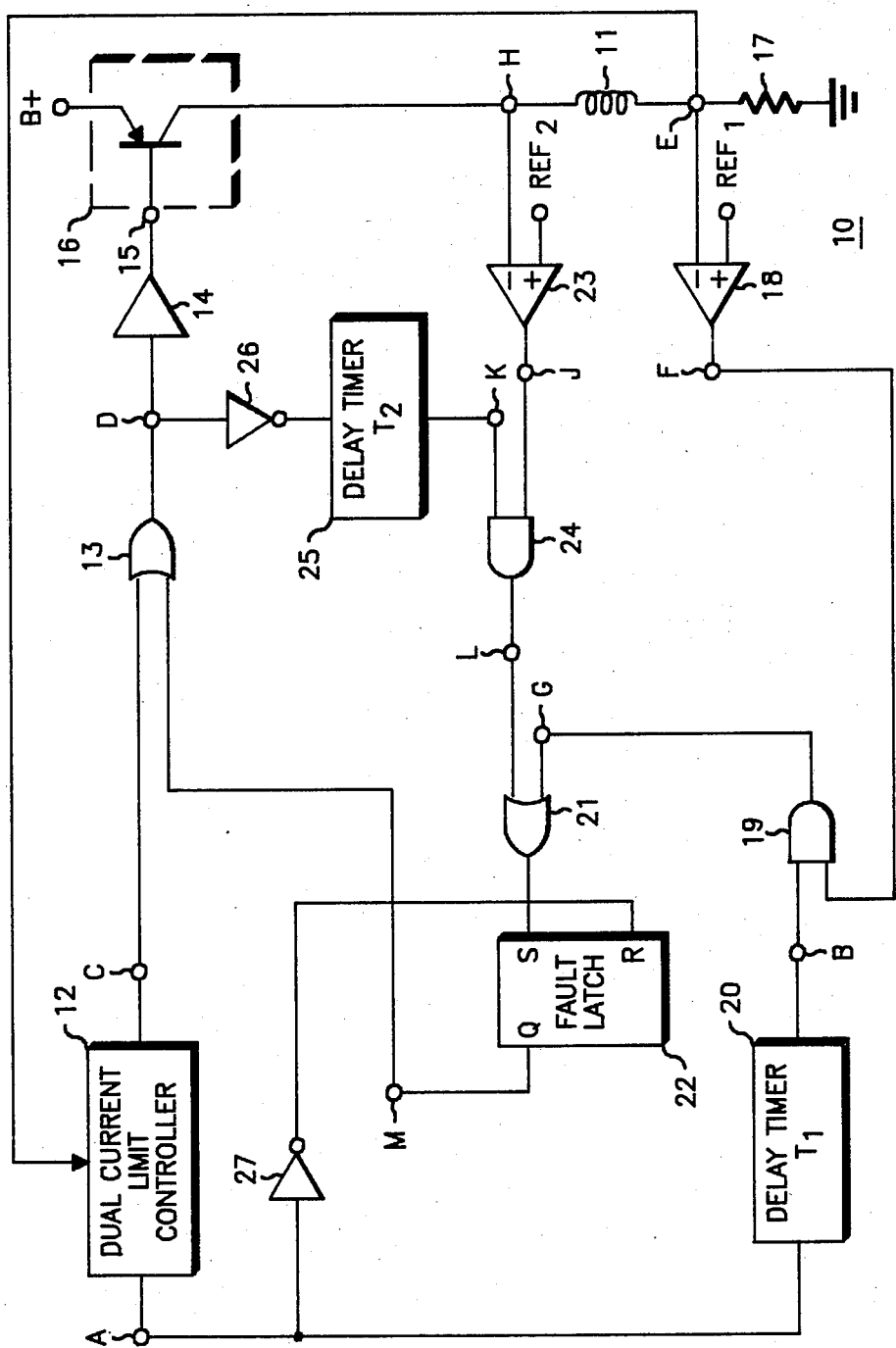
FIG. 1 comprises a schematic diagram of a solenoid fuel injector driver system which includes a fault detection circuit in accordance with the present invention.
Figure 2:
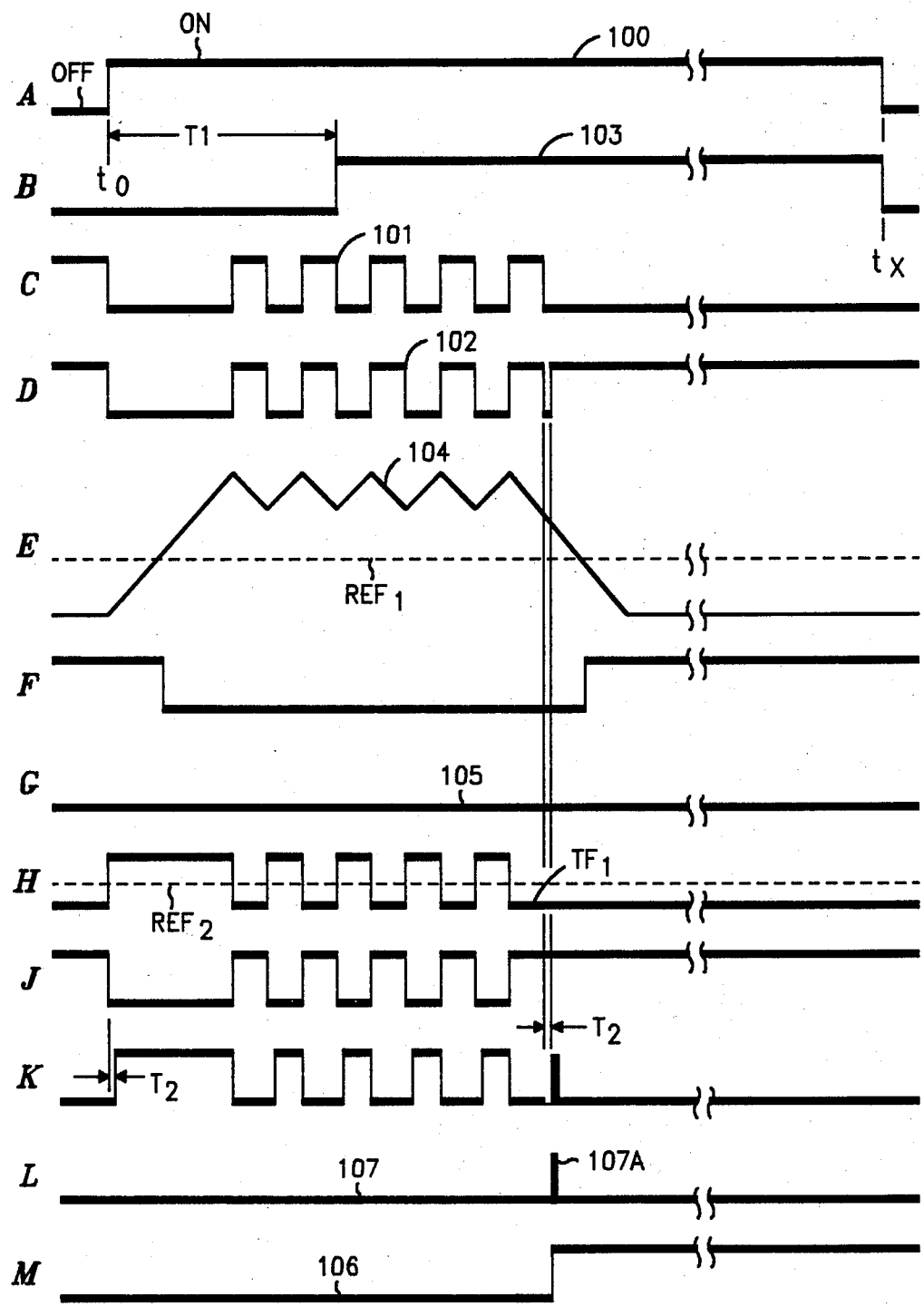
FIG. 2 comprises a series of graphs A through M representative of signal magnitudes at corresponding terminals A-M illustrated in FIG. 1 in the event of a short circuit appearing at one terminal of the system shown in FIG. 1.
Figure 3:
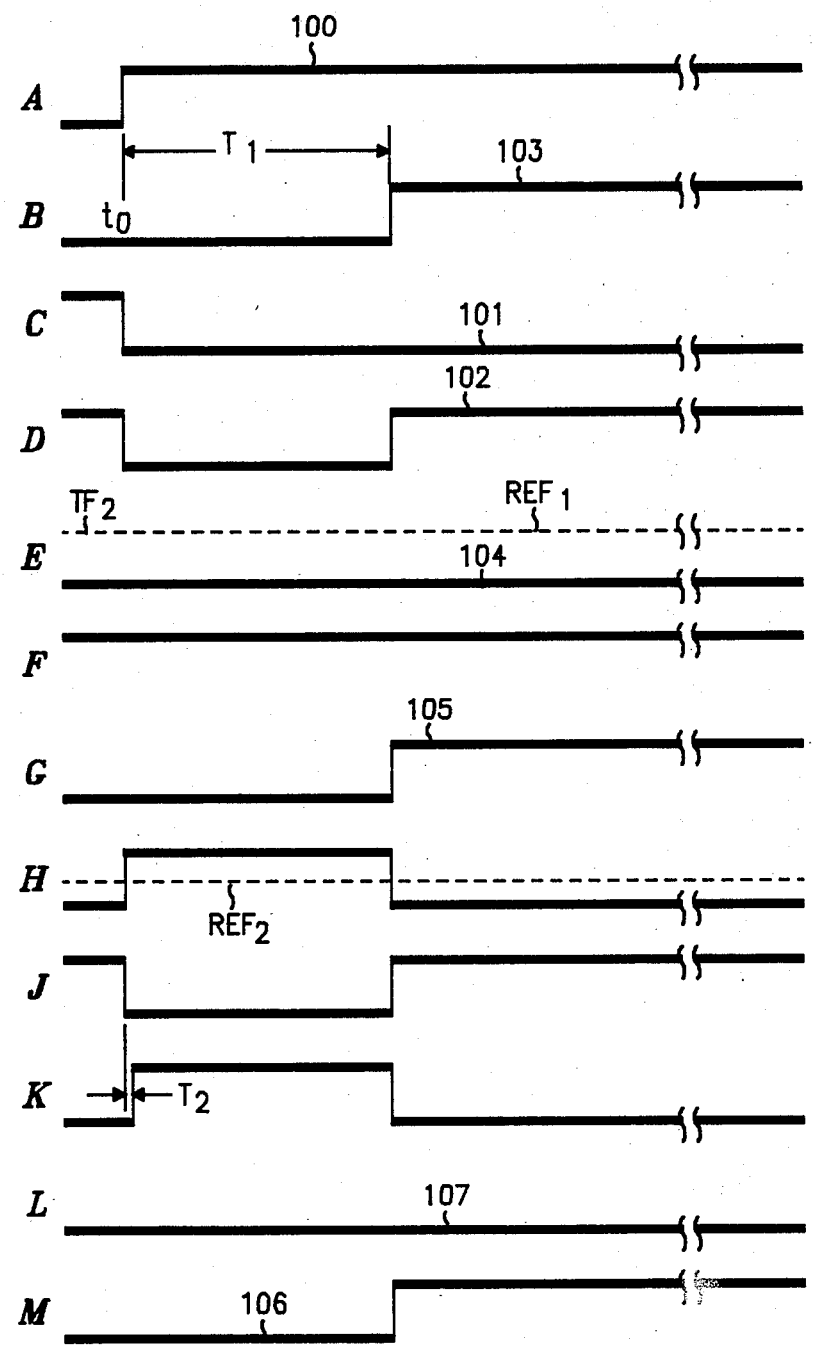
FIG. 3 comprises a series of graphs A through M representative of signal waveforms provided at corresponding terminals A-M of the system in FIG. 1 provided in response to a short circuit at another terminal.

Referring to FIG. 1, a solenoid fuel injector control system 10 is illustrated. Various terminals in the system 10 are identified by the letters A through M, and FIGS. 2 and 3 illustrate signal waveforms corresponding to electrical signals provided at these terminals under various conditions. Essentially, the fuel injector system 10 provides excitation for an inductive load comprising a solenoid coil 11 of a fuel injector, and fault detection circuitry in accordance with the present invention is provided such that short circuits to ground at first and second end terminals of the solenoid coil 11 (corresponding to terminals E and H) are detected so as to protect the output stage of the fuel injection system 10. The operation and structure of the system 10 in FIG. 1 will now be discussed with reference to the signal waveforms in FIGS. 2 and 3. The waveforms in FIG. 2 illustrate the operation of the system 10 prior to and after the occurrence of a short circuit to ground at terminal H which occurs at time TF1. FIG. 3 illustrates system operation in response to a short circuit to ground at terminal E occurring at a time TF2.

At an input terminal A, an effective enable signal 100 is provided having periodic off-to-on logic state transitions (low to high) at times $t_0$. During the presence of an on or high logic state of the signal 100 (from $t_0$ through $t_x$), a dual current limit controller 12 is effectively enabled such that it will provide pulse width modulation signals 101 at an output terminal C in accordance with sensed current corresponding to the current in the solenoid coil 11. This occurs by virtue of a direct connection between a terminal E in FIG. 1 and the dual current limit controller 12. Preferably, the structure of the dual current limit controller 12 corresponds to that illustrated in copending U.S. patent application Ser. No. 06/911,946, previously identified and assigned to the same assignee as the present invention. Thus, details concerning the structure and operation of the controller 12 will not be provided herein, except to state that the duty cycle of the signals at the terminal C, which essentially are switching signals, is controlled in accordance with a sensed current normally, in the absence of short circuits at terminals E or H, corresponding to the current in the solenoid coil 11.

The switching signals at the terminal C are coupled through an OR gate 13 to a terminal D and then through an amplifier 14 to a control terminal 15 of an output driver transistor 16 comprising a PNP transistor having its emitter connected to a source of positive potential B+, its base connected to the control terminal 15, and its collector connected to the second end terminal H. The terminal E, comprising the first end terminal of the solenoid coil 11, is connected to ground through a current sensing resistor 17, and this results in connecting the output of the transistor 16, the solenoid coil 11, and the current sensing resistor 17 in series between B+ potential and ground potential. Thus, the through current in each of these elements is substantially identical, since circuit connections to other elements in the system 10 do not divert any substantial amount of the current flowing through the output driver transistor 16, and then flowing into the solenoid coil 11 and the current sensing resistor 17.

The fuel injection system 10, as described above, essentially comprises an inductive load corresponding to the injector coil 11 in series with the sensing resistor 17 and the output of the drive transistor 16. In this system, the current controller 12, when enabled by the signal 100 at the terminal A, responds to the voltage at the terminal E which is representative of current through the solenoid coil 11, and normally provides a pulse width modulated switching signal 101 at the terminal C. In the absence of a short circuit detected at the terminals E or H, the signal 101 corresponds to a signal 102 provided at the terminal D. The signal 102 is the switching control signal effectively applied to the terminal 15, through amplifier 14, so as to preferably switch the output transistor 16 on and off to implement control of the solenoid current between predetermined limits in the manner discussed in the above-noted copending U.S. patent application. In this manner the controller 12 controls the effective signal magnitude, via pulse duration control, of the switch signal at terminal 15.

Essentially the current controller 12, while enabled, which corresponds to the existence of an on-logic state of the signal 100, acts to maintain at least a predetermined minimum current through the injector coil 11, wherein typically the switching of the transistor 16 results in having the current through the coil 11 cycle between limits that are above this predetermined minimum current limit. In a dual current controller, such as that discussed in the above-noted copending patent application, an initial effective high pull-in current is provided, and then a subsequent low holding current is provided. Therefore rapid actuation of the solenoid occurs in response to the high pull-in current, and then a lower maintaining current is utilized, for power conservation purposes, during the remaining portion of the enable period $(t_0-t_x)$ of the signal 100.

In systems such as that disclosed above, short circuits can occur at the first and second end terminals of the solenoid coil 11 corresponding to the terminals E and H, respectively. If a short circuit occurs at the terminal E, the dual current controller 12 will always believe that no current is flowing in the injector coil 11 and, therefore, will attempt to implement 100% duty cycle excitation for the transistor 16. This will eventually result in excessive current being drawn by the output stage since after a predetermined time, the coil 11 will present no significant AC impedance to the constant on condition of the output transistor 16. In order to prevent this, the present invention provides a first fault detection means comprising a voltage comparator 18 which essentially compares the voltage at the terminal E with a predetermined first reference voltage REF 1.

The output of the comparator 18 is provided at a terminal F which is connected as an input to an AND gate 19 that receives another input from a terminal B. The terminal A is connected to the terminal B through a 400 microsecond delay timer 20 wherein the 400 microsecond period is identified in FIGS. 2 and 3 by the time duration T1. The delay timer 20 essentially responds to a low-to-high enable transition of the signal 100 at the time $t_0$ by providing a similar logic transition after a subsequent delay time T1 corresponding to 400 microseconds. The output state of the timer 20 then remains high until a high-to-low transition of the input signal 100 at a subsequent time $t_x$. Such delay timers are conventional and well known.

The function of the delay timer 20 is to provide a predetermined delay time for a low-to-high transition of the signal at the terminal B which is identified as the signal 103 in FIGS. 2 and 3. This delay time is utilized to insure that if the voltage comparator 18 indicates that an insufficient voltage is developed at the terminal E, indicating a smaller than required through current through the solenoid coil 11, this is not necessarily indicative of a short circuit at the terminal E until a time sufficiently after the enable transition at the time $t_0$. This is because it is known that it takes an appreciable time for current to build up from a zero current level to some maximum current level in the inductive coil 11. This is illustrated by the signal 104 in graph E in FIG. 2, prior to the time TF1, which is representative of the voltage across the current sensing resistor 17 and, therefore, the current through the coil 11 in the absence of short circuits at either of the end terminals E or H. Thus, the function of the delay timer 20 is to insure that the voltage comparator 18 indicates a failure of the resistor 17 to sense at least a minimum current level only at a delay time after the effective turning on of the dual current controller 12 which delay time provides sufficient time for current buildup in the coil 11 if no short circuits are present.

The output of the AND gate 19 is provided at a terminal G which is connected as an input to an OR gate 21 that provides an output to a set terminal S of a fault latch 22. An output Q of the fault latch 22 is provided at a terminal M which is connected as an input to the OR gate 13, and the terminal A is connected as an input to a reset terminal R of the fault latch 22 through an inverter 27. The operation of the above-recited structure is as follows. The operation of the present invention will first be discussed in connection with a short circuit at terminal E, then in connection with a short circuit at terminal H.

Whenever a short circuit is present at the terminal E, a zero voltage will be present at this terminal. This results in a high logic state being provided at the terminal F which is indicative of a less than minimum current being sensed by the resistor 17 as corresponding to the current in the injector coil 11. The fact that a high logic state is provided at the terminal F cannot result in producing a fault detect signal at the terminal G until the T1 timer 20 provides a high logic state for the signal 103 at the terminal B. This occurs after a first delay time T1 subsequent to the enable transition at the time $t_0$. At this time, as shown in FIG. 3 which contemplates a short circuit to ground at terminal E commencing at time TF2, a low-to-high transition will occur at the terminal G, and a high logic state of a fault detection signal 105 at this terminal is indicative of a detected fault condition. The high logic state at the terminal G is passed through the OR gate 21 to the set terminal of the fault latch 22 resulting in setting the output of the fault latch to a high condition, thus providing a high logic state for a signal 106 at the terminal M. This, due to the action of the OR gate 13, results in the terminal D now remaining at a high logic state regardless of subsequent high or low logic states provided at the terminal C for the signal 101. This, in turn, results in maintaining the power output drive transistor 16 in an off condition until the fault latch 22 is reset. This effectively reduces current through the transistor 16 and coil 11 by control of the signal magnitude (actual magnitude or pulse duration) at the terminal 15. It should be noted that control of "signal magnitude", as discussed herein, contemplates either adjustment of an analog signal magnitude from one level to another or adjustment of the duration of digital pulses in a digital signal to adjust the effective average digital signal magnitude. The latter type of control is the one specifically implemented by the system 10.

For the configuration shown in FIG. 1, in response to a fault detection signal at the terminal G determining that a short circuit is present at the terminal E, the fault latch 22 remains set high until a subsequent high-to-low transition of the enable signal 100 at the terminal A. The low to high transition of signal 100 at $t_0$ causes signals 103 and 105 to have initial low logic states, while the high to low transition of signal 100 resets the fault latch 22 through inverter 27. Thus periodic resetting of the fault latch 22 is accomplished in accordance with each new enable logic state of signal 100 provided at the terminal A since the signal 100 is contemplated as being periodic.

If the short circuit at the terminal E cures itself during the period T1, proper continued operation of the injector system 10 may continue during the enable time representative of the high logic state of the signal 100. However, after the time $T_1$, if a short circuit is detected at the terminal E, then a high logic signal will be provided at the terminal G since the voltage at the terminal E is less than the reference voltage REF 1. In that case, as noted above, the fault latch 22 will remain in a set condition until the next high-to-low transition of the signal 100 at a subsequent time $t_x$.

While the operation of the fault detection circuit for detecting short circuits at the terminal E has been discussed in connection with monitoring the voltage at the terminal E, it is apparent that this corresponds to monitoring the sensed through-current sensed by the resistor 17 which current normally corresponds to the current in the injector coil 11. Essentially, a fault detection signal at the terminal G is provided in response to the sensed current being less than a predetermined minimum level of current, corresponding to the reference voltage REF 1. This determination occurs after the first predetermined delay time T1 implemented by the timer 20 as measured with respect to the low-to-high on transition of the enable signal 100 at $t_0$. In other words, the fault detection signal 105 at the terminal G is provided in accordance with the comparison implemented by the voltage comparator 18 wherein this comparison is effectively monitored after the first delay time T1 implemented by the timer 20.

The present invention has recognized that just detecting short circuits by monitoring the voltage at the terminal E (indicative of the current through the coil 11) may not be sufficient to adequately protect the transistor 16 if a short occurs at terminal H. For a short at terminal E during the time $T_1$, which has a relatively long duration, a substantial maximum current may flow during T1 through the transistor 16 and coil 11 due to the 100% duty cycle implemented by the dual current controller 12 in accordance with the low voltage signal provided at the terminal E. In addition, during this time $T_1$ the voltage B+ is essentially provided at the terminal H since the transistor 16 is on, and this provides voltage stress across the coil at a time when system operation is not properly functioning due to the presence of a short circuit at the terminal E. However, if the short circuit actually occurred at the terminal H, and no other fault detection circuit was provided, then an extremely large current would pass through the transistor 16 during the time $T_1$, and this would likely damage the transistor 16. To prevent this occurrence, an additional (second) fault detection circuit is provided by the present invention wherein this additional circuit monitors short circuits which may occur at the terminal H and provides fault detection signals in response thereto. This occurs in the following manner.

The terminal H is connected as an input to a voltage comparator 23 which effectively compares the voltage at the terminal H to a reference voltage REF 2. The output of the voltage comparator 23 is provided at a terminal J which is connected as an input to an AND gate 24 that provides an output at a terminal L that is connected as an input to the OR gate 21. The signal at the terminal L is essentially representative of a second fault detection signal since a high logic state for the signal at the terminal L is representative of a detected short circuit at the terminal H. The signal at the terminal L corresponds to the signal 107 shown in FIGS. 2 and 3.

In addition to the comparator 23 and the AND gate 24, the second fault detection circuit of the present invention includes a delay timer T2 implementing a 20 microsecond delay period and identified in FIG. 1 by the reference numeral 25. The delay timer 25 has an input derived from a connection to the terminal D through an inverter 26 and provides an output to a terminal K which is connected as an input to the AND gate 24. With this configuration, it can be seen that in response to each high-to-low transition of the signal 102 at the terminal D, the delay timer 25, after a 20 microsecond time delay designated as T2 in FIGS. 2 and 3, provides a corresponding but leading edge time delayed and inverted signal at the terminal K. This results in implementing a short time delay as contrasted with the substantially longer time delay T1 of timer 20.

When the signal 102 at terminal D goes low and, therefore, turns on the transistor 16, the voltage at the collector of the transistor is measured against REF2. The result of this comparison provided by the comparator 23, effectively takes place at a delay time T2 after the transistor 16 is turned on. This comparison will result in a fault detection signal at the terminal L if a short circuit is present at the terminal H. In other words, when the transistor 16 is turned on by a low signal at the terminal D, the collector should be rapidly switched to approximately B+ voltage. If a short circuit is present at the terminal H, excessive current will flow through the transistor 16 and the voltage at the terminal H will not exceed REF2. In such a case, the comparator 23 will provide a high voltage at the terminal J after the turning on of the transistor 16 and after the short delay time T2. For such a condition, the AND gate 24, after the time T2, will provide a high logic fault detection signal at the terminal L. The delay time T2 is provided to insure that the transistor 16 has sufficient time to respond to being turned on before the collector voltage is effectively monitored to determine if a short circuit at terminal H exists. Detecting a short at terminal H provides the high fault detection signal at terminal L, and this will result in setting the fault latch 22. Monitoring the voltage at the terminal H, via conparator 23, to detect short circuits thereat is also equivalent to effectively monitoring the voltage applied across the coil 11 to insure proper circuit operation. This is because the maximum voltage at E is essentially insignificant with respect to the voltage at H so the voltage at H is effectively a measure of the voltage across the coil 11.

Referring to FIG. 2, normal operation of the injector system 10 shown in FIG. 1 is illustrated until the time TF1 at which time a short circuit occurs at the terminal H. Prior to this time, current through the output transistor 16, solenoid coil 11 and current sensing resistor 17 essentially corresponded to the ramp voltage signal 104 provided at the terminal E by alternately switching the transistor 16 on and off in accordance with the pulse width modulated signal 102 at D provided by the current controller 12 in accordance with the signal at the terminal E. At the time TF1, which occurs after the time delay $T_1$ as illustrated in FIG. 2, the voltage at the terminal H will remain low due to the presence of a short circuit. Thus, during the next turning on of the transistor 16, an excessive amount of current will flow through the transistor 16 due to the short circuit at terminal H. However, the comparator 23 now provides a constant high logic signal at the terminal J, and, therefore, at the end of the relatively short delay time T2, as compared to the long delay time $T_1$, the AND gate 24 will provide a high logic output pulse 107A at the terminal L resulting in setting the fault latch 22. The output of the fault latch then terminates the low or on-logic state at the terminal D, and the current through the coil 11 and resistor 17 is reduced and continues to decline as shown in graph E in FIG. 2. This decline in current through the coil 11 continues to zero until the next off-to-on enable signal transition of the signal 100 at the terminal A. This latter mode of operation is illustrated in FIG. 2.

Referring to FIG. 3, the operation of the system 10 is illustrated in the event of a short circuit occurring at the terminal E at a time TF2 which is prior to the off-to-on enable transition at the time $t_0$. In this case, since the short is at the terminal E, the coil 11 will still provide a substantial impedance for current through the output drive transistor 16 during the delay time T1. However, during this time the coil is subject to excess current since B+ is continuously applied across the coil. Therefore it is desirable to detect a short at E and limit the duration of this stress. Unless short circuits at terminal E are detected, and current reduced in response thereto, a very large current may flow in the transistor 16 and coil 11 since the controller 12 cannot limit current if a short is at terminal E. At the end of the delay time T1, the comparator 18 will indicate that there is no current sensing voltage at the terminal E, and when this information is combined with the fact that the delay time T1 has expired, a fault detection signal 105 will be provided at the terminal G which will result in maintaining the fault latch set until the next attempt at enabling the current controller 12. The setting of latch 22 turns the transistor 16 off and reduces load current flow.

From the foregoing description of the operation of the present invention, it is apparent that detecting a short circuit at the second end terminal H of the coil 11 is imperative in order to prevent substantial excess current from flowing through the transistor 16 in the event of a short circuit at the terminal H. However, such a detection scheme does not help in detecting a short circuit at the terminal E, and, therefore, an additional fault detection circuit must be utilized to also detect faults at the end terminal E. Due to the nature of the load involved, an inductive load, various time delays are required to insure that the monitored voltages at the terminals E and H will properly result in the generation of fault detections in response to short circuits to ground occurring at the terminals E and H. The present invention implements these functions in a cost effective manner with a minimum number of components. Only a single fault latch is utilized which is responsive to fault detection signals indicative of short circuits at either the terminals E or H. Also, periodic resetting of fault latch is provided such that if the detected shorts are subsequently cured, normal operation is resumed.

While specific embodiments of the present invention have been shown and described, further modifications and improvements will occur to those skilled in the art. All such modifications which retain the basic underlying principles disclosed and claimed herein are within the scope of this invention.

We claim:

1. Fault detection circuit comprising:
   output driver means having a control terminal and at least one output terminal, current through said output driver means determined by signal magnitude at said control terminal;
   load means having first and second end terminals, said second end terminal coupled to said output terminal such that currrent through said output driver means determines current through said load means;
   current sense resistor means connected in series with said load means by being coupled between said first end terminal and a fixed reference potential such that current through said resistor means normally corresponds to current through said load means;
   current control means coupled to said resistor means for, in response to receiving an enable signal having signal transitions to a predetermined logic state, controlling signal magnitude at said control terminal in accordance with current through said resistor means to effectively provide at least a predetermined minimum current level through said load means during said logic state;
   wherein the improvement comprises,
   fault detection means coupled to said load means for detecting short circuits to said fixed reference potential present at either of said first and second end terminals and providing separate fault detection signals in response thereto; and
   fault control means coupled to said fault detection means for altering signal magnitude at said control terminal, in response to said fault detection signals, so as to effectively reduce current through at least one of said output driver means and said load means to prevent damage thereto in the event of a short circuit at any of said end terminals.

2. Fault detection circuit according to claim 1 wherein said fault detection means includes first means for providing a first one of said fault detection signals in response to determining current through said load means being less than said predetermined minimum current level after a first predetermined delay time after said transition of said enable signal to said predetermined logic state.

3. Fault detection circuit according to claim 2 wherein said first means includes comparator means for monitoring the voltage at said first end terminal and effectively comparing it to a predetermined first reference voltage, and means for providing said first one of said fault detection signals in accordance with an output of said comparator means after said first delay time.

4. Fault detection circuit according to claim 3 wherein said current control means provides switching of said output driver means on and off during said predetermined logic state to control load current between limits, and wherein said fault detection means includes second means for effectively monitoring the voltage at said second end terminal and comparing it to a predetermined second reference voltage, said second means providing a second one of said fault detection signals in accordance with said comparison of said second end terminal voltage after a predetermined second delay time after each switching of said output driver means by said current control means to a predetermined operative state.

5. Fault detection circuit according to claim 4 wherein said first delay time substantially exceeds said second delay time.

6. Fault detection circuit according to claim 4 wherein each of said first and second ones of said fault detection signals result in setting an output of a latch means in said fault control means to a predetermined state, said predetermined state implementing said current reduction.

7. Fault detection circuit according to claim 1 wherein said current control means provides switching of said output driver means on and off during said predetermined logic state to control load current between limits, and wherein said fault detection means includes means for effectively monitoring the voltage at said second end terminal and comparing it to a predetermined reference voltage, said fault detection providing one of said fault detections signals in accordance with said comparison after a predetermined delay time after each switching of said output driver means by said current control means to a predetermined operative state.

8. Fault detection circuit according to claim 1 wherein said output driver means is coupled in series with said load means and said resistor means such that each has substantially the same through current in the absence of short circuits at said first and second end terminals.

9. Fault detection circuit according to claim 1 wherein said fault control means includes latch means which is set to a predetermined state for implementing said current reduction in response to said fault detection signals.

10. Fault detection circuit according to claim 8 wherein said current control means includes means for providing a switching excitation signal at said control terminal, predetermined transitions in said excitation signal normally commencing current flow through said output driver means, and wherein said latch means is periodically reset in response to transitions in said enable signal.

11. Fault detection circuit for a fuel injector driver comprising:
  output driver means having a control terminal and at least one output terminal, current through said output driver means determined by signal magnitude at said control terminal;
  load means, comprising a fuel injector solenoid coil, having first and second end terminals, said second end terminal coupled to said output terminal such that current through said output driver means determines current through said load means;
  current sense resistor means connected in series with said load means by being coupled between said first end terminal and a fixed reference potential such that current through said resistor menas normally corresponds to current through said load means;
  current control means coupled to said resistor means for, in response to receiving an enable signal having signal transitions to a predetermined logic state, controlling signal magnitude at said control terminal in accordance with current through said resistor means to effectively provide at least a predetermined minumum current level through said load means during said logic state;
  wherein the improvement comprises,
  fault detection means coupled to said load means for detecting short circuits to said fixed reference potential present at either of said first and second end terminals and providing separate fault detection signals in response thereto; and
  fault control means coupled to said fault detection means for altering signal magnitude at said control terminal, in response to said fault detection signals, so as to effectively reduce current through at least one of said output driver means and said load means to prevent damage thereto in the event of a short circuit at any of said end terminals.

12. Fault detection circuit for a fuel injector driver according to claim 11 wherein said fault detection means includes first means for providing a first one of said fault detection signals in response to determining current through said load means being less than said predetermined minimum current level after a first predetermined delay time after said transition of said enable signal to said predetermined logic state.

13. Fault detection circuit for a fuel injector driver according to claim 12 wherein said first means includes comparator means for monitoring the voltage at said first end terminal and effectively comparing it to a predetermined first reference voltage, and means for providing said first one of said fault detection signals in accordance with an output of said comparator means after said first delay time.

14. Fault detection circuit for a fuel injector driver according to claim 13 wherein said current control means provides switching of said output driver means on and off during said predetermined logic state to control load current between limits, and wherein said fault detection means includes second means for effectively monitoring the voltage at said second end terminal and comparing it to a predetermined second reference voltage, said second means providing a second one of said fault detection signals in accordance with said comparison of said second end terminal voltage after a predetermined second delay time after each switching of said output driver means by said current control means to a predetermined operative state.

15. Fault detection circuit for a fuel injector driver according to claim 14 wherein said first delay time substantially exceeds said second delay time.

16. Fault detection circuit for a fuel injector driver according to claim 14 wherein each of said first and second ones of said fault detection signals result in setting an output of a latch means in said fault control means to a predetermined state, said predetermined state implementing said current reduction.

17. Fault detection circuit for a fuel injector driver according to claim 11 wherein said current control means provides switching of said output driver means on and off during said predetermined logic state to control load current between limits, and wherein said fault detection means includes means for effectively monitoring the voltage at said second end terminal and comparing it to a predetermined reference voltage, said fault detection providing one of said fault detections signals in accordance with said comparison after a predetermined delay time after each switching of said output driver means by said current control means to a predetermined operative state.

18. Fault detection circuit for a fuel injector driver according to claim 11 wherein said output driver means is coupled in series with said load means and said resistor means such that each has substantially the same through current in the absence of short circuits at said first and second end terminals 19. Fault detection circuit for a fuel injector driver according to claim 11 wherein said fault control means includes latch means which is set to a predetermined state for implementing said current reduction in response to said fault detection signals.

20. Fault detection circuit for a fuel injector driver according to claim 18 wherein said current control means includes means for providing a switching excitation signal at said control terminal, predetermined transitions in said excitation signal normally commencing current flow through said output driver means, and wherein said latch means is periodically reset in response to transitions in said enable signal.

21. Fault detection circuit comprising:

output driver means having a control terminal and at least one output terminal, current through said output driver means determined by signal magnitude at said control terminal;

load means coupled to said output terminal such that current through said output driver means determines current through said load means;

current sense resistor means coupled to said load means such that current through said resistor means normally corresponds to current through said load means;

current control means coupled to said resistor means for, in response to receiving an enable signal having signal transitions to a predetermined logic state, controlling signal magnitude at said control terminal in accordance with current through said resistor means to effectively provide at least a predetermined minimum current level through said load means during said logic state;

wherein the improvement comprises, fault detection means coupled to said load means and said current sense resistor means for detecting short circuits by effectively monitoring, during said logic state, the voltage applied across the load means and the current through the load means and providing separate first and second fault detection signals in response to either current through said load means being less than said predetermined minimum current level after a first predetermined delay time after said transition of said enable signal to said predetermined logic state or the voltage applied across said load being below a predetermined level, respectively; and fault control means coupled to said fault detection means for altering signal magnitude at said control terminal, in response to said fault detection signals, so as to effectively reduce current through at least one of said output driver means and said load means to prevent damage thereto in the event of a short circuit.

22. Fault detection circuit according to claim 21 wherein said fault detection means includes comparator means for effectively monitoring the voltage across said current sensing means and effectively comparing it to a predetermined first reference voltage, and means for providing said first fault detection signal in accordance with an output of said comparator means after said first delay time.

23. Fault detection circuit according to claim 22 wherein said current control means provides switching of said output driver means on and off during said predetermined logic state to control load current between limits, and wherein said fault detection means includes means for effectively monitoring the voltage across said load means and comparing it to a predetermined second reference voltage, and for providing said second fault detection signal in accordance with said comparison of said voltage across said load means after a predetermined second delay time after each switching of said output driver means by said current control means to a predetermined operative state.

24. Fault detection circuit according to claim 23 wherein said first delay time substantially exceeds said second delay time.

25. Fault detection circuit according to claim 24 wherein each of said first and second fault detection signals result in setting an output of a latch means in said fault control means to a predetermined state, said predetermined state implementing said current reduction.

26. Fault detection circuit according to claim 21 wherein said current control means provides switching of said output driver means on and off during said predetermined logic state to control load current between limits, and wherein said fault detection means includes means for effectively monitoring the voltage across said load means and comparing it to a predetermined second reference voltage, and for providing said second fault detection signal in accordance with said comparison of said voltage across said load means after a predetermined second delay time after each switching of said output driver means by said current control means to a predetermined operative state.

27. Fault detection circuit according to claim 21 wherein said output driver means is coupled in series with said load means and said resistor means such that each has substantially the same through current in the absence of short circuit faults.

28. Fault detection circuit according to claim 21 wherein said fault control means includes latch means which is set to a predetermined state for implementing said current reduction in response to said fault detection signals.

29. Fault detection circuit according to claim 28 wherein said latch means is periodically reset in response to transitions in said enable signal.

30. Fault detection circuit according to claim 21 wherein said load means comprises an inductive load having a substantial inductance.

* * * * *